(12) United States Patent
Gao

(10) Patent No.: US 11,101,808 B2
(45) Date of Patent: Aug. 24, 2021

(54) FREQUENCY MULTIPLIER, DIGITAL PHASE-LOCKED LOOP CIRCUIT, AND FREQUENCY MULTIPLICATION METHOD

(71) Applicant: Huawei Technologies Co., Ltd., Shenzhen (CN)

(72) Inventor: Peng Gao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/033,005

(22) Filed: Sep. 25, 2020

(65) Prior Publication Data

US 2021/0013892 A1  Jan. 14, 2021

Related U.S. Application Data

(63) Continuation of application No. PCT/CN2019/080613, filed on Mar. 29, 2019.

(30) Foreign Application Priority Data

Mar. 31, 2018 (CN) .......................... 201810278768.3

(51) Int. Cl.
*H03B 19/00* (2006.01)
*H03K 3/017* (2006.01)
(Continued)

(52) U.S. Cl.
CPC .............. *H03L 7/0992* (2013.01); *G06F 1/08* (2013.01); *H03B 19/00* (2013.01); *H03K 3/017* (2013.01);
(Continued)

(58) Field of Classification Search
CPC .... H03B 19/00; H03K 3/017; H03K 5/00006; H03L 2207/50
See application file for complete search history.

(56) References Cited

U.S. PATENT DOCUMENTS 5,963,071 A  10/1999  Dowlatabadi
6,426,660 B1  7/2002  Ho et al.
(Continued)

FOREIGN PATENT DOCUMENTS

CN  103929159 A  7/2014
CN  104124945 A  10/2014
(Continued)

OTHER PUBLICATIONS

Hsueh, Y., et al., "A 0.29mm2 Frequency Synthesizer in 40nm CMOS with 0.19psrms Jitter and -100dBc Reference Spur for 802.11ac," ISSCC 2014 / Session 28 / Mixed-Signal Techniques for Wireless / 28.2, 2014, pp. 472-474.
(Continued)

*Primary Examiner* — Levi Gannon
(74) *Attorney, Agent, or Firm* — Conley Rose, P.C.

(57) ABSTRACT

A frequency multiplier, a digital phase-locked loop circuit, and a frequency multiplication method, where the frequency multiplier includes a clock controller configured to: receive an output signal from a time-to-digital converter in the digital phase-locked loop circuit, and generate a control signal based on a duty cycle error of the output signal, a clock calibration circuit configured to: receive a reference clock signal, calibrate a duty cycle of the reference clock signal based on the control signal, and output a calibrated clock signal, and a clock frequency multiplier configured to: receive the calibrated clock signal, multiply a frequency of the calibrated clock signal, and output a frequency multiplied signal to the time-to-digital converter.

20 Claims, 5 Drawing Sheets

(51) Int. Cl.
*H03L 7/099* (2006.01)
*G06F 1/08* (2006.01)
*H03K 5/00* (2006.01)
*H03K 19/21* (2006.01)

(52) U.S. Cl.
CPC ......... *H03K 5/00006* (2013.01); *H03K 19/21* (2013.01); *H03K 2005/00078* (2013.01); *H03L 2207/50* (2013.01)

(56) References Cited

U.S. PATENT DOCUMENTS

| | | | |
|---|---|---|---|
| 8,049,569 B1* | 11/2011 | Wright | H03L 7/104 331/44 |
| 9,124,250 B2 | 9/2015 | Hinrichs | |
| 9,455,854 B2* | 9/2016 | Gao | H04B 17/21 |
| 9,634,678 B1 | 4/2017 | Caffee et al. | |
| 9,923,563 B1 | 3/2018 | Horovitz et al. | |
| 2010/0013530 A1* | 1/2010 | Kim | H03L 7/0812 327/149 |
| 2013/0141149 A1 | 6/2013 | Hsueh et al. | |
| 2013/0222016 A1* | 8/2013 | Ichikawa | H03L 7/0816 327/115 |
| 2014/0340132 A1 | 11/2014 | Terrovitis | |
| 2016/0380752 A1* | 12/2016 | Ahmad | H03L 7/085 327/158 |
| 2017/0187364 A1 | 6/2017 | Park et al. | |
| 2017/0205772 A1 | 7/2017 | Burg et al. | |
| 2017/0288686 A1* | 10/2017 | Gao | H03L 7/081 |
| 2019/0007036 A1 | 1/2019 | Fu | |
| 2019/0163228 A1* | 5/2019 | Gupta | H03L 7/14 |

FOREIGN PATENT DOCUMENTS

| | | |
|---|---|---|
| CN | 105743463 A | 7/2016 |
| CN | 107046421 A | 8/2017 |
| WO | 2014130174 A1 | 8/2014 |

OTHER PUBLICATIONS

Ghahramani, M., "A 192MHz Differential XO Based Frequency Quadrupler with Sub-Picosecond Jitter in 28nm CMOS," 2015 IEEE Radio Frequency Integrated Circuits Symposium, 2015, pp. 59-62.

* cited by examiner

FREQUENCY MULTIPLIER, DIGITAL PHASE-LOCKED LOOP CIRCUIT, AND FREQUENCY MULTIPLICATION METHOD

CROSS-REFERENCE TO RELATED APPLICATIONS

This application is a continuation of International Patent Application No. PCT/CN2019/080613 filed on Mar. 29, 2019, which claims priority to Chinese Patent Application No. 201810278768.3 filed on Mar. 31, 2018. The disclosures of the aforementioned applications are hereby incorporated by reference in their entireties.

TECHNICAL FIELD

This application relates to the field of communications technologies, and in particular, to a frequency multiplier, a digital phase-locked loop circuit, and a frequency multiplication method.

BACKGROUND

A radio frequency transceiver widely uses a frequency synthesizer of a phase-locked loop structure to generate a local oscillation signal, to perform signal frequency conversion. Phase noises of the local oscillation signal directly affect quality of a communication signal, and affect a throughput. In other approaches, a frequency of a reference clock in a phase-locked loop is increased to improve phase noise performance of the phase-locked loop. Ideally, a timing relationship between a reference clock signal and a frequency multiplied signal that is obtained after frequency multiplication may be shown in FIG. 1. CLK_REF2X denotes the frequency multiplied signal that is obtained after frequency multiplication is performed on the reference clock signal CLK_REF. A frequency of the frequency multiplied signal is twice a frequency of the reference clock signal, but a cycle TREF2X of CLK_REF2X is only half of a cycle TREF of CLK_REF.

However, quality of an output signal in a clock frequency multiplier circuit in the other approaches heavily relies on a duty cycle of an input reference clock signal. Two adjacent clock cycles of the output signal CLK_REF2X in the clock frequency multiplier circuit alternate when the duty cycle of the input reference clock signal is not 50%. For details, refer to FIG. 2. In FIG. 2, the two adjacent clock cycles of CLK_REF2X are TR2A and TR2B respectively, and TR2A is less than TR2B. Such an alternating clock cycle is equivalent to a result of introducing a high-frequency frequency modulation signal to the reference clock signal. Consequently, a spurious signal may occur in output signals in the phase-locked loop circuit. This compromises performance of a radio frequency communications system.

Therefore, how to calibrate the duty cycle of the reference clock signal is an urgent problem to be resolved.

SUMMARY

Embodiments of this application provide a frequency multiplier, a digital phase-locked loop circuit, and a frequency multiplication method, to calibrate a duty cycle of a reference clock signal.

An embodiment of this application provides a frequency multiplier, applied to a digital phase-locked loop circuit and including a clock controller configured to receive an output signal of a time-to-digital converter in the digital phase-locked loop circuit, and generate a control signal based on a duty cycle error of the output signal, a clock calibration circuit configured to receive a reference clock signal, calibrate a duty cycle of the reference clock signal based on the control signal, and output a calibrated clock signal, and a clock frequency multiplier configured to receive the calibrated clock signal, multiply a frequency of the calibrated clock signal, and output a frequency multiplied signal to the time-to-digital converter.

In the foregoing solution, because the output signal of the time-to-digital converter may indicate a difference between the duty cycle of the reference clock signal and an ideal duty cycle, a duty cycle error of the reference clock signal may be determined based on the output signal. In this way, the control signal generated based on the duty cycle error can be used to accurately calibrate the duty cycle of the reference clock signal such that a calibrated duty cycle of the reference clock signal approaches the ideal duty cycle. In this way, the duty cycle of the reference clock signal is calibrated.

In an optional implementation, the clock controller is further configured to determine the duty cycle error based on a difference between two adjacent discrete point signals of the output signal, and perform an integral operation on the duty cycle error to obtain the control signal.

In an optional implementation, the clock controller includes a differentiator. The differentiator is configured to receive the output signal, and use a difference between a value of a $k^{th}$ discrete point signal of the output signal and a value of a $(k-1)^{th}$ discrete point signal of the output signal as a value of the $k^{th}$ discrete point signal in the duty cycle error, where k is a natural number greater than or equal to 1.

In an optional implementation, the clock controller further includes a sampler and an integrator. The sampler is configured to sample one discrete point signal every P discrete point signals in the duty cycle error to obtain a sampled signal, where P is equal to 2n and n is an integer greater than 0. The integrator is configured to perform an integral operation on the sampled signal to obtain the control signal.

In the foregoing solution, the duty cycle error is sampled, which can reduce a quantity of discrete point signals used to calculate the control signal. Therefore, calculation complexity is reduced, and calculation efficiency is improved.

In an optional implementation, the clock controller further includes an absolute value calculator and an integrator. The absolute value calculator is configured to receive the duty cycle error, calculate and output an absolute value for the value of the $k^{th}$ discrete point signal in the duty cycle error, to obtain a duty cycle error after an absolute value operation, where k is a natural number greater than or equal to 1. The integrator is configured to perform an integral operation on the duty cycle error obtained after the absolute value operation, to obtain the control signal.

In the foregoing solution, the absolute value for the duty cycle error is calculated and then the integral operation is performed. Therefore, the control signal can be calculated based on a complete duty cycle error, and the obtained control signal is more accurate.

In an optional implementation, the clock frequency multiplier includes a clock delay circuit configured to perform delay processing on the calibrated clock signal to obtain a delayed signal, and an XOR gate circuit configured to perform XOR processing on the calibrated clock signal and the delayed signal, generate a signal obtained after the frequency of the calibrated clock signal is multiplied, and output the obtained signal to the time-to-digital converter.

An embodiment of this application provides a digital phase-locked loop circuit, including a time-to-digital converter configured to generate an output signal based on a phase relationship between a frequency multiplied signal and a negative feedback clock signal, where the output signal indicates a phase difference between the frequency multiplied signal and the negative feedback clock signal, a digital loop filter configured to perform loop filtering on the output signal to obtain an oscillator frequency control signal, a digital controlled oscillator configured to output an oscillation signal under the control of the oscillator frequency control signal, a frequency divider configured to perform frequency division on the oscillation signal, to obtain the negative feedback clock signal, and a frequency multiplier configured to receive the output signal and a reference clock signal, generate a control signal based on a duty cycle error of the output signal, calibrate a duty cycle of the reference clock signal based on the control signal to obtain a calibrated clock signal, and generate the frequency multiplied signal based on the calibrated clock signal.

In the foregoing solution, because the output signal of the time-to-digital converter may indicate a difference between the duty cycle of the reference clock signal and an ideal duty cycle, a duty cycle error of the reference clock signal may be determined through the output signal. In this way, the control signal generated based on the duty cycle error can be used to accurately adjust the duty cycle of the reference clock signal such that an adjusted duty cycle of the reference clock signal approaches the ideal duty cycle. In this way, the duty cycle of the reference clock signal is calibrated.

In an optional implementation, the frequency multiplier is further configured to determine the duty cycle error based on a difference between two adjacent discrete point signals of the output signal, and perform an integral operation on the duty cycle error to obtain the control signal.

In an optional implementation, the frequency multiplier is further configured to use a difference between a value of a $k^{th}$ discrete point signal of the output signal and a value of a $(k-1)^{th}$ discrete point signal of the output signal as a value of the $k^{th}$ discrete point signal in the duty cycle error, where k is a natural number greater than or equal to 1.

In an optional implementation, the frequency multiplier is further configured to sample one discrete point signal every P discrete point signals in the duty cycle error to obtain a sampled signal, where P is equal to 2n and n is an integer greater than 0, and perform an integral operation on the sampled signal to obtain the control signal.

In an optional implementation, the frequency multiplier is further configured to receive the duty cycle error, calculate and output an absolute value for a value of a $k^{th}$ discrete point signal in the duty cycle error, to obtain a duty cycle error after an absolute value operation, where k is a natural number greater than or equal to 1, and perform an integral operation on the duty cycle error obtained after the absolute value operation, to obtain the control signal.

In an optional implementation, the frequency multiplier is further configured to perform delay processing on the calibrated clock signal to obtain a delayed signal, and perform XOR processing on the calibrated clock signal and the delayed signal, to generate the frequency multiplied signal.

An embodiment of this application provides a frequency multiplication method, including receiving an output signal of a time-to-digital converter in a digital phase-locked loop circuit, and generating a control signal based on a duty cycle error of the output signal, and calibrating a duty cycle of a received reference clock signal based on the control signal to obtain a calibrated clock signal, multiplying a frequency of the calibrated clock signal, and outputting a frequency multiplied signal.

In the foregoing solution, because the output signal of the time-to-digital converter may indicate a difference between the duty cycle of the reference clock signal and an ideal duty cycle, a duty cycle error of the reference clock signal may be determined through the output signal. In this way, the control signal generated based on the duty cycle error can be used to accurately adjust the duty cycle of the reference clock signal such that an adjusted duty cycle of the reference clock signal approaches the ideal duty cycle. In this way, the duty cycle of the reference clock signal is calibrated.

In an optional implementation, generating a control signal based on a duty cycle error of the output signal includes determining the duty cycle error based on a difference between two adjacent discrete point signals of the output signal, and performing an integral operation on the duty cycle error to obtain the control signal.

In an optional implementation, determining the duty cycle error based on a difference between two adjacent discrete point signals of the output signal includes using a difference between a value of a $k^{th}$ discrete point signal of the output signal and a value of a $(k-1)^{th}$ discrete point signal of the output signal as a value of the $k^{th}$ discrete point signal in the duty cycle error, to obtain the duty cycle error, where k is a natural number greater than or equal to 1.

In an optional implementation, performing an integral operation on the duty cycle error to obtain the control signal includes sampling one discrete point signal every P discrete point signals in the duty cycle error to obtain a sampled signal, where P is equal to 2n and n is an integer greater than 0, and performing an integral operation on the sampled signal to obtain the control signal.

In an optional implementation, performing an integral operation on the duty cycle error to obtain the control signal includes calculating and outputting an absolute value for a value of a $k^{th}$ discrete point signal in the duty cycle error, to obtain a duty cycle error after an absolute value operation, where k is a natural number greater than or equal to 1, and performing an integral operation on the duty cycle error obtained after the absolute value operation, to obtain the control signal.

In an optional implementation manner, the multiplying a frequency of the calibrated clock signal includes performing delay processing on the calibrated clock signal to obtain a delayed signal, and performing XOR processing on the calibrated clock signal and the delayed signal, to obtain a signal that is obtained after the frequency of the calibrated clock signal is multiplied.

DESCRIPTION OF EMBODIMENTS

The following describes the embodiments of this application in detail with reference to the accompanying drawings in this specification.

Figure 1:
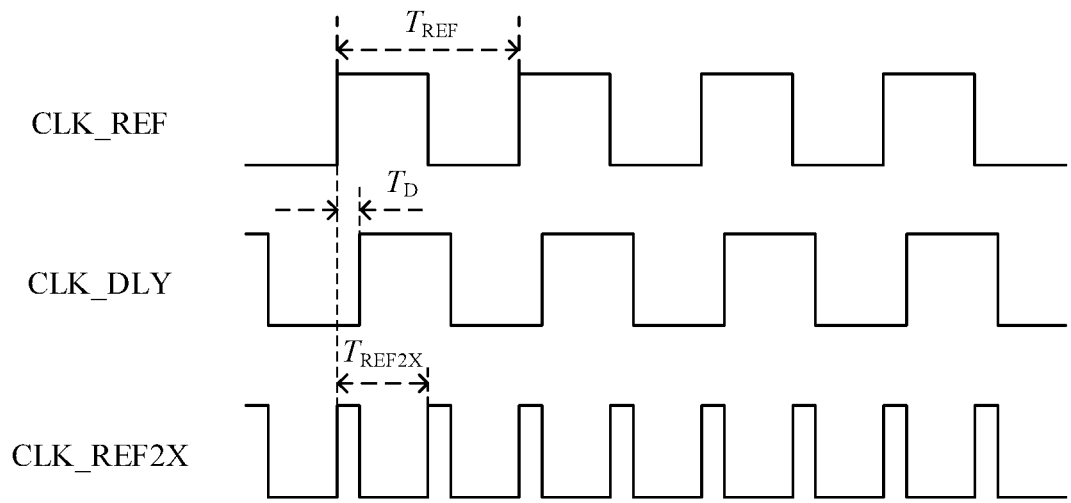
FIG. 1 is a schematic diagram of a reference clock signal according to an embodiment of this application.
Figure 2:
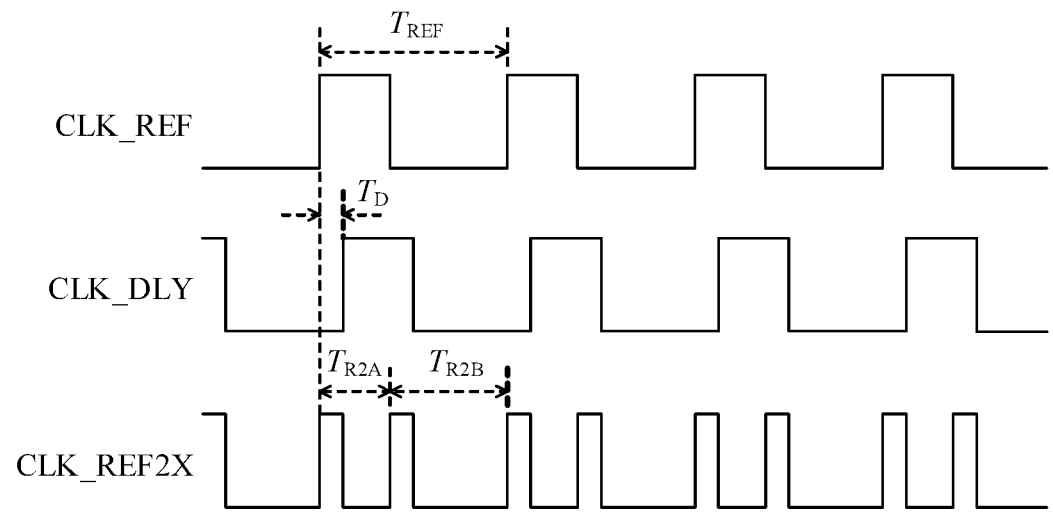
FIG. 2 is a schematic diagram of an output signal of a clock frequency multiplier circuit according to an embodiment of this application.
Figure 3:
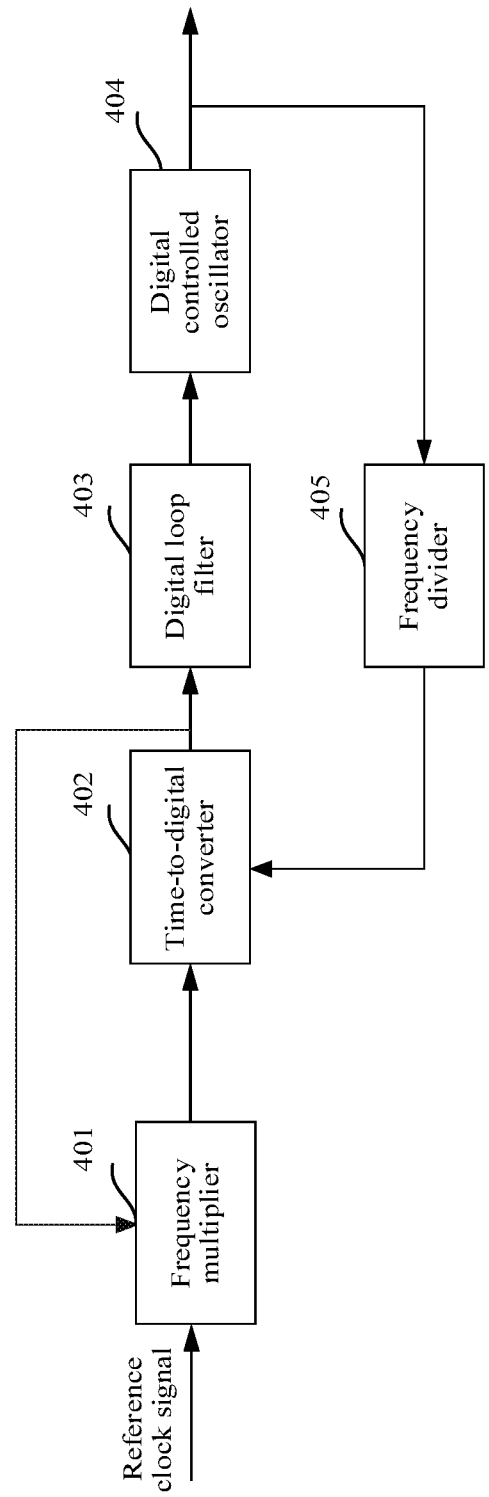
FIG. 3 is a schematic structural diagram of a digital phase-locked loop circuit according to an embodiment of this application.

A frequency multiplier provided in the embodiments of this application may be applied to a digital phase-locked loop circuit. FIG. 3 is a schematic structural diagram of a digital phase-locked loop circuit according to an embodiment of this application. The digital phase-locked loop circuit shown in FIG. 3 includes a frequency multiplier 401, a time-to-digital converter (TDC) 402, a digital loop filter (DLF) 403, a digital controlled oscillator (DCO) 404, and a frequency divider (DIV) 405.

An output signal of the time-to-digital converter 402 is a discrete signal.

The time-to-digital converter 402 is configured to generate the output signal based on a phase relationship between a frequency multiplied signal and a negative feedback clock signal. The output signal indicates a phase difference between the frequency multiplied signal and the negative feedback clock signal.

The digital loop filter 403 is configured to perform loop filtering on the output signal to obtain an oscillator frequency control signal.

The digital controlled oscillator 404 is configured to output an oscillation signal under the control of the oscillator frequency control signal.

The frequency divider 405 is configured to perform frequency division on the oscillation signal, to obtain the negative feedback clock signal.

The frequency multiplier 401 is configured to receive the output signal and a reference clock signal, generate a control signal based on a duty cycle error of the output signal, calibrate a duty cycle of the reference clock signal based on the control signal to obtain a calibrated clock signal, and generate the frequency multiplied signal based on the calibrated clock signal. The frequency multiplied signal is a signal obtained after a frequency of the calibrated clock signal is multiplied.

As described above, after doubling the frequency of the received reference clock signal, the frequency multiplier 401 outputs the frequency multiplied signal to the time-to-digital converter 402. In this embodiment of this application, the frequency multiplier 401 further receives the output signal of the time-to-digital converter 402, and adjusts the duty cycle of the reference clock signal based on the output signal of the time-to-digital converter 402. In this way, the duty cycle of the reference clock signal is adjusted to 50%. Therefore, a problem that a spurious signal occurs in output signals of the digital phase-locked loop circuit when the duty cycle of the reference clock signal is not 50% is resolved. Details are described below.

It should be noted that, for functions and specific implementations of other modules in the digital phase-locked loop circuit shown in FIG. 3, refer to descriptions in the other approaches. Details are not described in this embodiment of this application.

Figure 4:
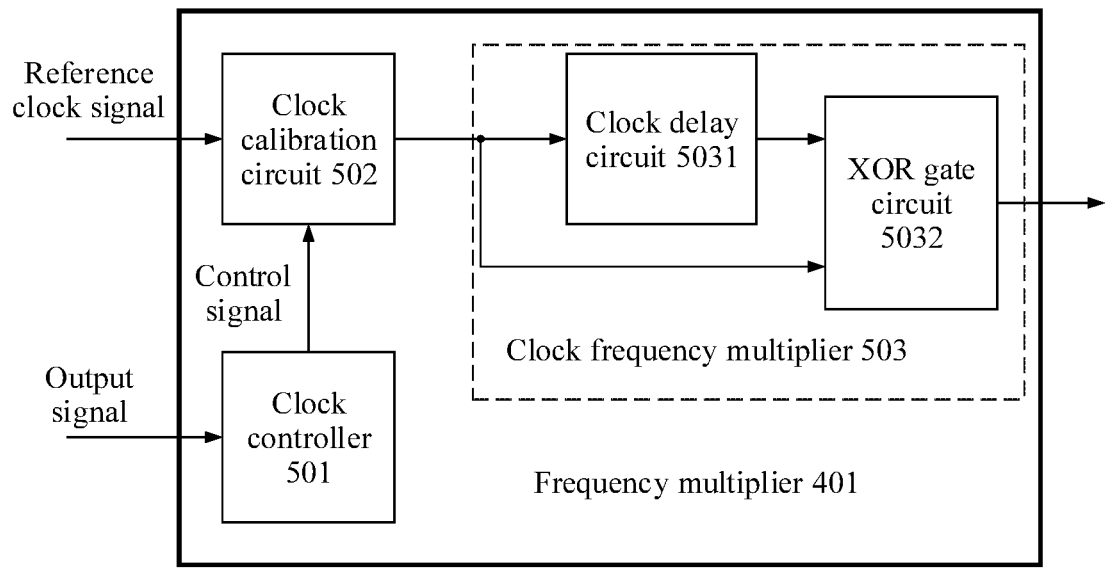
FIG. 4 is a schematic structural diagram of a frequency multiplier according to an embodiment of this application.

With reference to FIG. 3, a structure of the frequency multiplier 401 in FIG. 3 may be shown in FIG. 4. The frequency multiplier 401 shown in FIG. 4 includes a clock controller 501, a clock calibration circuit 502, and a clock frequency multiplier 503.

The clock controller 501 is configured to receive an output signal of a time-to-digital converter in a digital phase-locked loop circuit, and generate a control signal based on a duty cycle error of the output signal.

The clock calibration circuit 502 is configured to receive a reference clock signal, calibrate a duty cycle of the reference clock signal based on the control signal, and output a calibrated clock signal.

The clock frequency multiplier 503 is configured to receive the calibrated clock signal, multiply a frequency of the calibrated clock signal, and output a frequency multiplied signal to the time-to-digital converter.

In this embodiment of this application, the clock frequency multiplier 503 may include a clock delay circuit 5031 and an XOR gate circuit 5032.

The clock delay circuit 5031 is connected to an output end of the clock calibration circuit 502, and performs delay processing on a received clock signal that is calibrated by the clock calibration circuit 502, and then outputs a signal obtained after delay processing to the XOR gate circuit 5032. An input end of the XOR gate circuit 5032 is connected to an output end of the clock delay circuit 5031, and another input end of the XOR gate circuit 5032 is connected to the output end of the clock calibration circuit 502. After performing XOR processing on signals received through the two input ends, the XOR gate circuit 5032 obtains a frequency multiplied signal and outputs the frequency multiplied signal to the time-to-digital converter.

It should be noted that specific implementations of the clock delay circuit 5031 and the XOR gate circuit 5032 are not limited in this embodiment of this application, and details are not described herein.

In an embodiment of this application, an output signal of the time-to-digital converter 402 in the digital phase-locked loop circuit is a discrete signal, and an absolute value for a value of each discrete point signal of the output signal of the time-to-digital converter 402 is proportional to a duty cycle error of a reference clock signal. The duty cycle error of the reference clock signal CLK_REF is equal to a difference between the duty cycle of the reference clock signal CLK_REF and an ideal duty cycle (that is, 50%).

With reference to FIG. 3, input signals of the time-to-digital converter 402 are a frequency multiplied signal CLK_REF2X and a negative feedback clock signal CLK_DIV. The frequency multiplied signal CLK_REF2X is a signal output after the frequency multiplier 401 multiplies a frequency of the reference clock signal. The negative feedback clock signal CLK_DIV is a signal that is output after the frequency divider 405 performs frequency division processing on an output signal of the time-to-digital converter 402.

The time-to-digital converter 402 determines a phase difference between the frequency multiplied signal CLK_REF2X and the negative feedback clock signal CLK_DIV in each clock cycle, and determines the output signal based on the phase difference. Further, a value $R_{TDC}[k]$ of a $k^{th}$ discrete point signal of the output signal of the time-to-digital converter 402 satisfies the following formula:

$$R_{TDC}[k] = K_{TDC} \times \frac{\varphi_k}{2\pi} \times T_{REF2X}. \tag{1}$$

$K_{TDC}$ denotes a conversion gain of the time-to-digital converter 402, and $K_{TDC}$ is a preset value. $\varphi_k$ denotes the phase difference between the frequency multiplied signal CLK_REF2X and the negative feedback clock signal CLK_DIV. $T_{REF2X}$ denotes a clock cycle of the negative feedback clock signal CLK_DIV and is half of a clock cycle of the reference clock signal.

Figure 5:
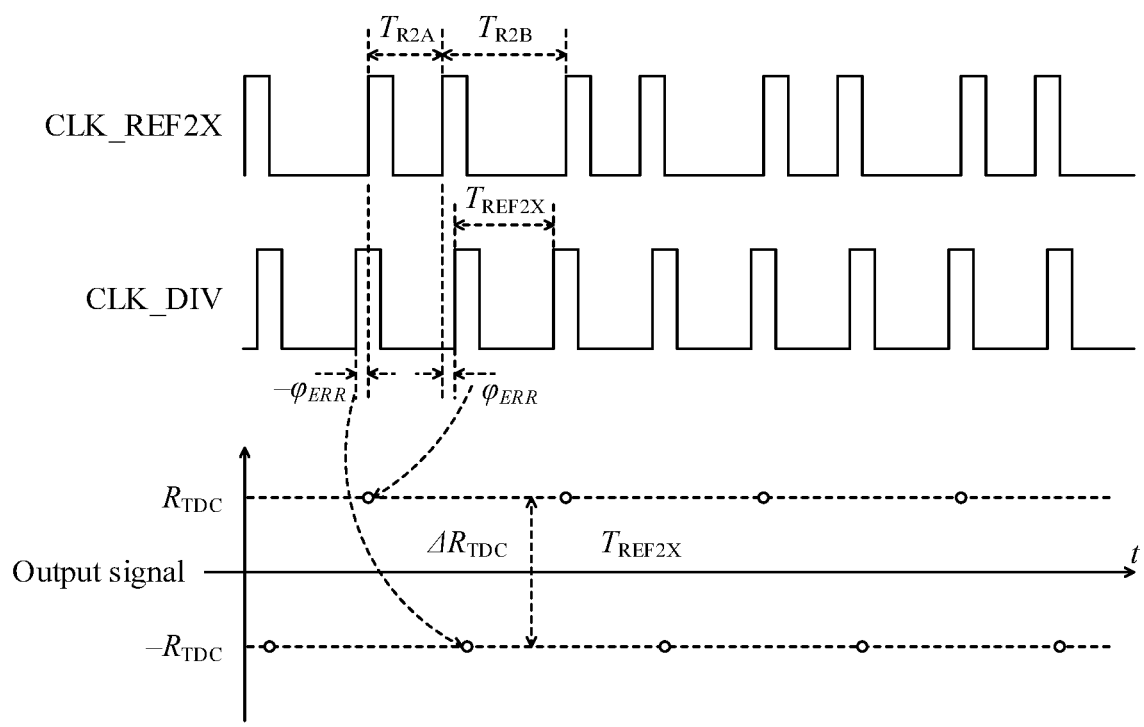
FIG. 5 is a schematic diagram of a signal according to an embodiment of this application.

Further, FIG. 5 is a schematic diagram of a signal according to an embodiment of this application. Two adjacent clock cycles, namely, $T_{R2A}$ and $T_{R2B}$, of the frequency multiplied signal CLK_REF2X alternate when the duty cycle of the reference clock signal is not 50%. When the digital phase-locked loop circuit is in a locked state, the phase difference between the frequency multiplied signal CLK_REF2X and the negative feedback clock signal CLK_DIV that are received by the time-to-digital converter in the digital phase-locked loop circuit is not 0 in each clock cycle, but alternates between $\varphi_{ERR}$ and $-\varphi_{ERR}$. The time-to-digital converter 402 outputs $R_{TDC}$ when the phase difference between the frequency multiplied signal CLK_REF2X and the negative feedback clock signal CLK_DIV is $\varphi_{ERR}$. The time-to-digital converter 402 outputs $-R_{TDC}$ when the phase difference between the frequency multiplied signal CLK_REF2X and the negative feedback clock signal CLK_DIV is $-\varphi_{ERR}$. An absolute value for a difference between values of two adjacent discrete point signals of the output signal of the time-to-digital converter 402 is $\Delta R_{TDC}$. A value of $\Delta R_{TDC}$ is proportional to the duty cycle error of the reference clock signal CLK_REF. A larger duty cycle error of the reference clock signal CLK_REF indicates a larger $\Delta R_{TDC}$, and a smaller duty cycle error of the reference clock signal CLK_REF indicates a smaller $\Delta R_{TDC}$.

In this embodiment of this application, the clock controller 501 may determine the duty cycle error based on the output signal of the time-to-digital converter 402, and then determine a control signal based on the duty cycle error. The duty cycle error indicates a value of the duty cycle error of the reference clock signal CLK_REF received by the digital phase-locked loop circuit.

In this embodiment of this application, the clock controller 501 may determine the duty cycle error based on the difference between two adjacent discrete point signals of the output signal, and perform an integral operation on the duty cycle error to obtain the control signal. Details are described below based on different scenarios.

Figure 6:
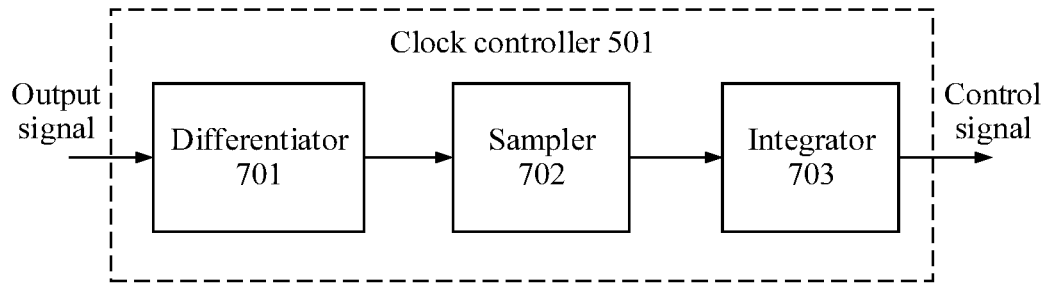
FIG. 6 is a schematic structural diagram of a clock controller according to an embodiment of this application.

In a first possible scenario, as shown in FIG. 6, the clock controller 501 includes a differentiator 701, a sampler 702, and an integrator 703.

The differentiator 701 is configured to receive an output signals of a time-to-digital converter, and use a difference between a value of a $k^{th}$ discrete point signal of the output signal and a value of a $(k-1)^{th}$ discrete point signal of the output signal as a value of the $k^{th}$ discrete point signal in the duty cycle error. k is a natural number greater than or equal to 1. That is, k=1, 2, 3 . . . .

With reference to the formula (1), the output signal TDC_OUT of the time-to-digital converter may be expressed as follows:

$$\text{TDC\_OUT}=\{\ldots, R_{TDC}[k-1], R_{TDC}[k], R_{TDC}[k+1], \ldots\}, k=1,2,3\ldots.$$

The duty cycle error DIFF_OUT output by the differentiator 701 may be expressed as follows:

$$\text{DIFF\_OUT}=\{\ldots, \Delta R_{TDC}[k-1], \Delta R_{TDC}[k], \Delta R_{TDC}[k+1], \ldots\}, k=1,2,3\ldots.$$

The value $\Delta R_{TDC}[k]$ of the $k^{th}$ discrete point signal in the duty cycle error output by the differentiator 701 may be determined according to the following formula:

$$\Delta R_{TDC}[k]=R_{TDC}[k]-R_{TDC}[k-1]. \quad (2)$$

$R_{TDC}[k]$ is the value of the $k^{th}$ discrete point signal of the output signal of the time-to-digital converter. $R_{TDC}[k-1]$ is the value of the $(k-1)^{th}$ discrete point signal of the output signal of the time-to-digital converter. As described above, because values of discrete points of the output signal of the time-to-digital converter 402 are $-R_{TDC}$ and $R_{TDC}$ that are output alternately, the duty cycle error output by the differentiator 701 actually consists of $\Delta R_{TDC}$ and $-\Delta R_{TDC}$ that alternate. $\Delta R_{TDC}$ is an absolute value for a difference between $-R_{TDC}$ and $R_{TDC}$.

The sampler 702 is configured to receive the duty cycle error and sample one discrete point signal every P discrete point signals in the duty cycle error to obtain a sampled signal. P is equal to 2n and n is an integer greater than 0.

With reference to the foregoing description, the sampled signal SMP_OUT output by the sampler 702 may be expressed as follows:

$$\text{SMP\_OUT}=\{\ldots, \Delta R_{TDC}[k-P], \Delta R_{TDC}[k], \Delta R_{TDC}[k+P], \ldots\}, k=1,2,3\ldots.$$

Because a quantity of discrete points for the sampled signal is reduced, for ease of understanding, n is used as an identifier of a sampling point for the sampled signal, and the sampled signal is expressed as follows:

$$\text{SMP\_OUT}=\{\ldots, \Delta R'_{TDC}[n-1], \Delta R'_{TDC}[n], \Delta R'_{TDC}[n+1], \ldots\}, n=1,2,3\ldots.$$

The integrator 703 is configured to receive the sampled signal and perform an integral operation on the sampled signal to obtain the control signal.

...

$$\Delta R'_{TDC}[n-m] = \Delta R_{TDC}[k - P \times m]$$

...

$$\Delta R'_{TDC}[n-1] = \Delta R_{TDC}[k - P]$$

$$\Delta R'_{TDC}[n] = \Delta R_{TDC}[k]$$

$$\Delta R'_{TDC}[n+1] = \Delta R_{TDC}[k + P]$$

...

$$\Delta R'_{TDC}[n+m] = \Delta R_{TDC}[k + P \times m]$$

...

In this embodiment of this application, the control signal output by the integrator 703 is also a discrete signal. Further, after receiving an $n^{th}$ discrete point signal of the sampled signal, the integrator 703 may determine a value $V_{DCC\_CTRL}[n]$ of an $n^{th}$ discrete point signal of the control signal DCC_CTRL according to the following formula:

$$V_{DCC\_CTRL}[n]=K_{DCC} \times \Sigma_{i=0}^{n} \Delta R'_{TDC}[i]. \quad (3)$$

$K_{DCC}$ is a duty cycle control coefficient, and a specific value of the duty cycle control coefficient depends on an actual situation.

Figure 7:
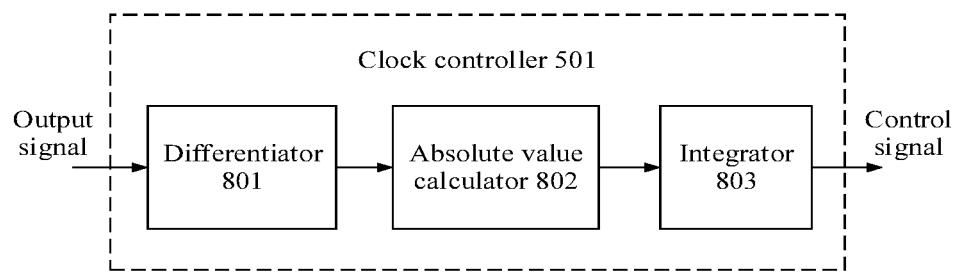
FIG. 7 is a schematic structural diagram of a clock controller according to an embodiment of this application.

In a second possible scenario, as shown in FIG. 7, the clock controller 501 includes a differentiator 801, an absolute value calculator 802, and an integrator 803.

The differentiator 801 is configured to receive an output signal of a time-to-digital converter, and use a difference between a value of a $k^{th}$ discrete point signal of the output signal and a value of a $(k-1)^{th}$ discrete point signal of the output signal as a value of the $k^{th}$ discrete point signal in the duty cycle error, to obtain the duty cycle error, where k=1, 2, 3 . . . .

For a specific process in which the differentiator 801 determines the duty cycle error, refer to the foregoing description. Details are not described herein.

The absolute value calculator 802 is configured to receive the duty cycle error, calculate and output an absolute value for the value of the $k^{th}$ discrete point signal in the duty cycle error, to obtain a duty cycle error after an absolute value operation, where k=1, 2, 3 . . . .

The integrator 803 is configured to perform an integral operation on the duty cycle error obtained after the absolute value operation, to obtain the control signal.

Assuming that the differentiator 801 outputs $\Delta R_{TDC}[k]$ at a $k^{th}$ sampling moment, a value output by the absolute value calculator 802 at this moment is:

$$\Delta R'_{TDC} = |\Delta R_{TDC}[k]|.$$

Correspondingly, after receiving a $k^{th}$ discrete point output by the absolute value calculator 802, the integrator 803 may determine the value $V_{DCC\_CTRL}[k]$ of the $k^{th}$ discrete point signal of the control signal DCC_CTRL based on the following formula:

$$V_{DCC\_CTRL}[k] = K_{DCC} \times \Sigma_{i=0}^{k} \Delta R'_{TDC}[i]. \quad (4)$$

$K_{DCC}$ is a duty cycle control coefficient.

Optionally, in this embodiment of this application, the clock controller 501 may further determine the duty cycle error based on a difference between values of two discrete point signals that are of the output signal and m discrete points apart, and perform an integral operation on the duty cycle error to obtain the control signal, where m is an odd number. In this case, the differentiator 701 is configured to receive the output signal of the time-to-digital converter, and use a difference between the value of the $k^{th}$ discrete point signal of the output signal and a value of a $(k-m)^{th}$ discrete point signal of the output signal as the value of the $k^{th}$ discrete point signal in the duty cycle error. For a process of performing an integral operation on the duty cycle error, refer to the foregoing description. Details are not described herein.

After the clock controller 501 outputs the generated control signal DCC_CTRL to the clock calibration circuit 502, the clock calibration circuit 502 adjusts the duty cycle of the reference clock signal based on the control signal, and outputs the calibrated clock signal. A duty cycle of the calibrated clock signal output by the clock calibration circuit 502 is in a negative feedback relationship with the input control signal.

It should be noted that a manner used by the clock calibration circuit 502 to adjust the duty cycle of the reference clock signal based on the control signal output by the clock controller 501 is not limited in this embodiment of this application.

Figure 8:
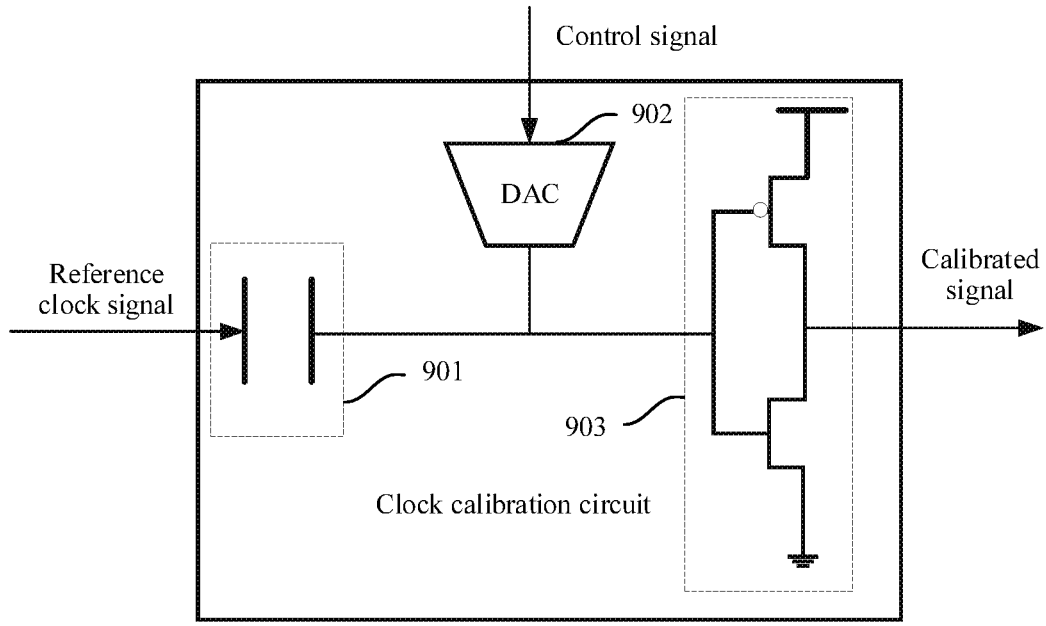
FIG. 8 is a schematic structural diagram of a clock calibration circuit according to an embodiment of this application.

For example, the clock calibration circuit 502 may be shown in FIG. 8. The clock calibration circuit shown in FIG. 8 includes a capacitor 901, a digital-to-analog converter (DAC) 902, an output buffer 903, and the like. According to the circuit shown in FIG. 8, a control signal DCC_CTRL is equivalent to a bias voltage for the output buffer 903. When bias voltages are different, the output buffer 903 outputs control signals with different duty cycles, and a duty cycle of a calibrated clock signal CLK_REF_DCC output by the clock calibration circuit 502 is in a negative feedback relationship with an input control signal. Further, a relatively large duty cycle of a reference clock signal CLK_REF input by the clock calibration circuit 502 indicates a relatively large duty cycle error of the reference clock signal CLK_REF_DCC. The duty cycle error of the reference clock signal CLK_REF_DCC is equal to a difference between the duty cycle of the reference clock signal CLK_REF_DCC and 50%. Then, it can be learned from the circuit shown in FIG. 3 or FIG. 4 that an absolute value $\Delta R_{TDC}$ for a difference between values of two adjacent discrete point signals of an output signal of a time-to-digital converter is larger. Further, a value of the control signal DCC_CTRL output by the clock controller is larger according to formula (4). Therefore, a duty cycle of a signal output by the output buffer 903 is smaller. Because of the negative feedback relationship, a duty cycle of the calibrated clock signal generated after the clock calibration circuit adjusts the reference clock signal CLK_REF_DCC based on the control signal approaches 50%. In this way, the duty cycle of the reference clock signal is calibrated.

It should be noted that, FIG. 8 is merely an example and the clock calibration circuit 502 may alternatively be implemented in another manner. For example, the clock calibration circuit 502 may be a delay chain circuit. Details are not described herein.

An embodiment of this application further provides a frequency multiplication method, which may be applied to a digital phase-locked loop circuit. The method is used to adjust a duty cycle of a received reference clock signal in the digital phase-locked loop circuit, to obtain a reference clock signal with a duty cycle of 50%. Therefore, a problem that a spurious signal occurs in output signals of the digital phase-locked loop circuit when the duty cycle of the reference clock signal is not 50% is resolved.

Figure 9:
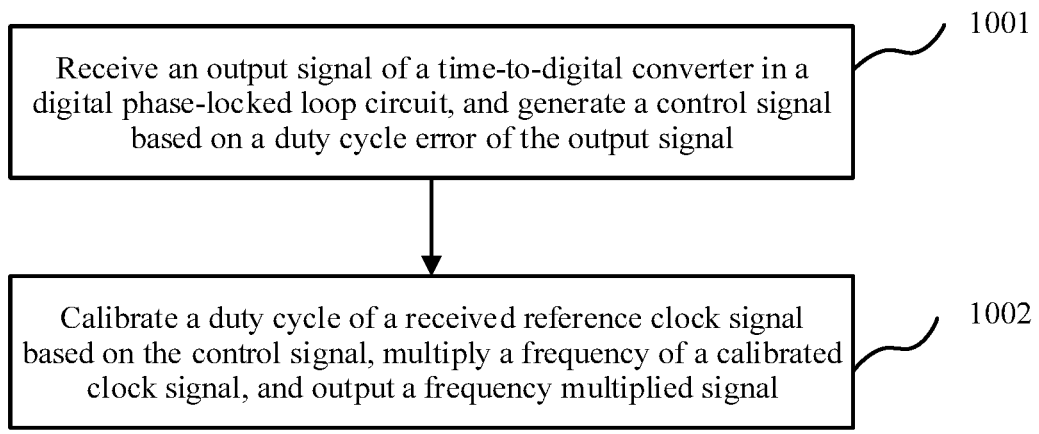
FIG. 9 is a schematic flowchart of a frequency multiplication method according to an embodiment of this application.

Referring to FIG. 9, the method includes the following steps.

Step 1001: Receive an output signal of a time-to-digital converter in the digital phase-locked loop circuit, and generate a control signal based on a duty cycle error of the output signal.

In this embodiment of this application, the duty cycle error may be determined based on a difference between two adjacent discrete point signals of the output signal. Details are as follows.

A difference between a value of a $k^{th}$ discrete point signal of the output signal and a value of a $(k-1)^{th}$ discrete point signal of the output signal as a value of the $k^{th}$ discrete point signal in the duty cycle error, to obtain the duty cycle error, where k is a natural number greater than or equal to 1.

Alternatively, in this embodiment of this application, a difference between a value of a $k^{th}$ discrete point signal of the output signal and a value of a $(k-m)^{th}$ discrete point signal of the output signal as a value of the $k^{th}$ discrete point signal in the duty cycle error, to obtain the duty cycle error, where k is a natural number greater than or equal to 1. m is an odd number.

In this embodiment of this application, the control signal may be obtained in any one of the following manners.

In an optional implementation, one discrete point signal may be sampled every P discrete point signals in the duty cycle error to obtain a sampled signal, where P is equal to 2n and n is an integer greater than 0.

Then, an integral operation is performed on the sampled signal to obtain the control signal.

In an optional implementation, that the control signal is determined based on a result of an integral operation performed on the duty cycle error includes the following.

An absolute value for the value of the $k^{th}$ discrete point signal in the duty cycle error is calculated and output, to obtain a duty cycle error after an absolute value operation, where k is a natural number greater than or equal to 1.

Then, an integral operation is performed on the duty cycle error obtained after the absolute value operation, to obtain the control signal.

For specific content of the foregoing step, refer to the foregoing description. Details are not described herein.

Step 1002: Calibrate the duty cycle of the received reference clock signal based on the control signal to obtain a calibrated clock signal, multiply a frequency of the calibrated clock signal, and output a frequency multiplied signal.

Step 1001 and step 1002 may be performed by a frequency multiplier in the digital phase-locked loop circuit. For details, refer to the frequency multiplier shown in FIG. 4. Details are not described herein.

After the frequency multiplier in the digital phase-locked loop circuit multiplies the frequency of the calibrated clock signal, the time-to-digital converter in the digital phase-locked loop circuit may output an output signal based on a phase relationship between a calibrated clock signal obtained after frequency multiplication and a negative feedback clock signal. The output signal indicates a phase difference between the frequency multiplied signal and the negative feedback clock signal.

A digital loop filter in the digital phase-locked loop circuit is configured to perform loop filtering on the output signal to obtain an oscillator frequency control signal.

A digital controlled oscillator in the digital phase-locked loop circuit is configured to output an oscillation signal under the control of the oscillator frequency control signal.

A frequency divider in the digital phase-locked loop circuit is configured to perform frequency division on the oscillation signal, to obtain the negative feedback clock signal.

Obviously, a person skilled in the art can make various modifications and variations to this application without departing from the scope of this application. This application is intended to cover these modifications and variations of this application provided that they fall within the scope of protection defined by the following claims and their equivalent technologies.

What is claimed is:

1. A frequency multiplier in a digital phase-locked loop circuit, comprising:
    a clock controller configured to:
        receive a first output signal from a time-to-digital converter; and
        generate a control signal based on the first output signal;
    a clock calibration circuit configured to:
        receive the control signal;
        receive a reference clock signal; and
        output a calibrated clock signal based on the reference clock signal and the control signal; and
    a clock frequency multiplier configured to:
        receive the calibrated clock signal;
        multiply a frequency of the calibrated clock signal to obtain a frequency-multiplied signal; and
        output the frequency-multiplied signal to the time-to-digital converter.

2. The frequency multiplier of claim 1, wherein the clock controller is further configured to:
    output a duty cycle error based on a first difference between two adjacent discrete point signals of the first output signal; and
    perform integral operations on the duty cycle error to obtain the control signal.

3. The frequency multiplier of claim 2, wherein the clock controller is further configured to set a second difference between a value of a $k^{th}$ discrete point signal of the first output signal and a value of a $(k-1)^{th}$ discrete point signal of the first output signal as the value of the $k^{th}$ discrete point signal in the duty cycle error, and wherein k is a natural number greater than or equal to 1.

4. The frequency multiplier of claim 2, wherein the clock controller is further configured to:
    sample one discrete point signal of every 2n discrete point signals in the duty cycle error to obtain a sampled signal, wherein n is an integer greater than zero; and
    perform the integral operations on the sampled signal to obtain the control signal.

5. The frequency multiplier of claim 1, wherein the clock controller comprises a differentiator that is configured to:
    receive the first output signal; and
    generate a second output signal.

6. The frequency multiplier of claim 5, wherein the clock controller further comprises:
    a sampler configured to sample the second output signal to obtain a sampled signal; and
    an integrator coupled to the sampler and configured to perform an integral operation on the sampled signal to obtain the control signal.

7. The frequency multiplier of claim 5, wherein the clock controller further comprises:
    an absolute value calculator configured to:
        receive the second output signal; and
        obtain a duty cycle error after an absolute value operation; and
    an integrator coupled to the absolute value calculator and configured to perform an integral operation on the duty cycle error to obtain the control signal.

8. The frequency multiplier of claim 5, wherein the first output signal is a discrete signal, and wherein an absolute value of each discrete point signal of the first output signal is proportional to a duty cycle error.

9. The frequency multiplier of claim 8, wherein the duty cycle error is equal to a third difference between a duty cycle of the reference clock signal and an ideal duty cycle.

10. The frequency multiplier of claim 1, wherein the clock frequency multiplier comprises:
    a clock delay circuit configured to perform delay processing on the calibrated clock signal to obtain a delayed signal; and
    an exclusive or (XOR) gate circuit configured to:
        perform XOR processing on the calibrated clock signal and the delayed signal;
        generate the frequency-multiplied signal; and
        output the frequency-multiplied signal to the time-to-digital converter.

11. The frequency multiplier of claim 1, wherein the clock calibration circuit is further configured to calibrate a duty cycle of the reference clock signal based on the control signal to obtain the calibrated clock signal.

12. A digital phase-locked loop circuit comprising:
  a frequency multiplier comprising:
    a first input configured to couple to a reference clock;
    a second input; and
    a first output;
  a time-to-digital converter comprising:
    a third input;
    a fourth input coupled to the first output; and
    a second output coupled to the second input;
  a digital loop filter comprising:
    a fifth input coupled to the second output; and
    a third output;
  a digital controlled oscillator comprising:
    a sixth input coupled to the third output; and
    a fourth output; and
  a frequency divider comprising:
    a seventh input; and
    a fifth output coupled to the third input and the seventh input.

13. The digital phase-locked loop circuit of claim 12, wherein the frequency multiplier comprises:
  a clock calibration circuit comprising:
    an eighth input coupled to the reference clock;
    a ninth input; and
    a sixth output;
  a clock controller comprising:
    a tenth input coupled to the second output; and
    a seventh output coupled to the ninth input; and
  a clock frequency multiplier comprising:
    an eleventh input coupled to the sixth output; and
    an eighth output coupled to the fourth input.

14. The digital phase-locked loop circuit of claim 13, wherein the clock controller comprises:
  a differentiator comprising:
    a twelfth input coupled to the second output; and
    a ninth output;
  a sampler comprising:
    a thirteenth input coupled to the ninth output; and
    a tenth output; and
  an integrator comprising:
    a fourteenth input coupled to the tenth output; and
    an eleventh output coupled to the ninth input.

15. The digital phase-locked loop circuit of claim 13, wherein the clock controller comprises:
  a differentiator comprising:
    a twelfth input coupled to the second output; and
    a ninth output;
  an absolute value calculator comprising:
    a thirteenth input coupled to the ninth output; and
    a tenth output; and
  an integrator comprising:
    a fourteenth input coupled to the tenth output; and
    an eleventh output coupled to the ninth input.

16. The digital phase-locked loop circuit of claim 13, wherein the clock frequency multiplier comprises:
  a clock delay circuit comprising:
    a twelfth input coupled to the sixth output; and
    a ninth output; and
  an exclusive or (XOR) gate circuit comprising:
    a thirteenth input coupled to the ninth output;
    a fourteenth input coupled to the sixth output; and
    a tenth output coupled to the fourth input.

17. A frequency multiplier comprising:
  a clock calibration circuit comprising:
    a first input configured to couple to a reference clock;
    a second input; and
    a first output;
  a clock controller comprising:
    a third input coupled to a second output of a time-to-digital converter; and
    a third output coupled to the second input; and
  a clock frequency multiplier comprising:
    a fourth input coupled to the first output; and
    a fourth output coupled to a fifth input of the time-to-digital converter.

18. The frequency multiplier of claim 17, wherein the clock controller comprises:
  a differentiator comprising:
    a sixth input coupled to the second output; and
    a fifth output;
  a sampler comprising:
    a seventh input coupled to the fifth output; and
    a sixth output; and
  an integrator comprising:
    an eighth input coupled to the fifth output; and
    a seventh output coupled to the second input.

19. The frequency multiplier of claim 17, wherein the clock controller comprises:
  a differentiator comprising:
    a sixth input coupled to the second output; and
    a fifth output;
  an absolute value calculator comprising:
    a seventh input coupled to the fifth output; and
    a sixth output; and
  an integrator comprising:
    an eighth input coupled to the sixth output; and
    a seventh output coupled to the second input.

20. The frequency multiplier of claim 17, wherein the clock frequency multiplier comprises:
  a clock delay circuit comprising:
    a sixth input coupled to the first output; and
    a fifth output; and
  an exclusive or (XOR) gate circuit comprising:
    a seventh input coupled to the fifth output;
    an eighth input coupled to the first output; and
    a sixth output coupled to the fifth input.

* * * * *